(12) United States Patent
Yamaoka

(10) Patent No.: US 11,221,113 B2
(45) Date of Patent: Jan. 11, 2022

(54) LIGHT-EMITTING DEVICE AND METHOD FOR MANUFACTURING THE SAME

(71) Applicant: NICHIA CORPORATION, Anan (JP)

(72) Inventor: Kensuke Yamaoka, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/582,645

(22) Filed: Sep. 25, 2019

(65) Prior Publication Data

US 2020/0096163 A1 Mar. 26, 2020

(30) Foreign Application Priority Data

Sep. 26, 2018 (JP) .............................. JP2018-179930

(51) Int. Cl.
*F21K 9/90* (2016.01)
*F21S 41/32* (2018.01)
*F21S 41/141* (2018.01)
*F21S 41/43* (2018.01)

(52) U.S. Cl.
CPC .............. *F21K 9/90* (2013.01); *F21S 41/141* (2018.01); *F21S 41/32* (2018.01); *F21S 41/43* (2018.01)

(58) Field of Classification Search
CPC ......... F21K 9/90; F21S 41/141; F21S 41/151; F21S 41/192; F21S 41/285; F21S 41/32; F21S 41/40; F21S 41/43; H01L 25/0753; H01L 2933/0058; H01L 33/46; H01L 33/50; H01L 33/58; H01L 33/60
See application file for complete search history.

(56) References Cited

U.S. PATENT DOCUMENTS

2016/0093780 A1* 3/2016 Beppu ..................... H01L 33/60
257/98

FOREIGN PATENT DOCUMENTS

JP  2014-127679 A  7/2014
JP  2017-161862 A  9/2017

* cited by examiner

*Primary Examiner* — Joseph L Williams
(74) *Attorney, Agent, or Firm* — Foley & Lardner LLP

(57) ABSTRACT

A method for manufacturing a light-emitting device includes: a mounting step; a light-shielding frame placement step; a light-transmissive member placement step; a light-guiding supporting member formation step; a light-guiding supporting member bonding step; and a second light-reflective member formation step.

10 Claims, 8 Drawing Sheets

LIGHT-EMITTING DEVICE AND METHOD FOR MANUFACTURING THE SAME

CROSS-REFERENCE TO RELATED APPLICATION

This application claims priority to Japanese Patent Application No. 2018-179930, filed on Sep. 26, 2018, the disclosure of which is hereby incorporated herein by reference in its entirety.

BACKGROUND

The present disclosure relates to a light-emitting device and a method for manufacturing the same.

In recent years, high-power light-emitting devices including light-emitting elements, such as LEDs, are increasingly used as light sources for vehicles and the like. For example, Japanese Patent Publication No. 2014-127679 discloses a high-power light-emitting device used as a light source for a vehicle in which a heat dissipation layer is formed to cover the periphery of the light-emitting surface of a light-emitting element to enhance the heat dissipation effect. According to Japanese Unexamined Patent Application Publication No. 2014-127679, the light-emitting device in Japanese Unexamined Patent Application Publication No. 2014-127679 provides sharp-edged light distribution characteristics in addition to improvement in the heat dissipation characteristics because the heat dissipation layer is formed to cover the periphery of the light-emitting surface of the light-emitting element, and the light-emitting device is suitable for use as, for example, a vehicle headlamp. The sharp-edged light distribution characteristics in Japanese Patent Publication No. 2014-127679 are interpreted to mean that the difference in luminance between the inside and the outside of the light exit surface is large.

SUMMARY

However, a light-emitting device used as a high-power light source for a vehicle or the like is required to more efficiently output light emitted from the light-emitting element. In addition, a method for easily manufacturing such a light-emitting device is desired.

Accordingly, an object of certain embodiments of the present invention is to provide a light-emitting device that shows a large difference in luminance between the inside and the outside of the light exit surface. Another object of certain embodiments of the present invention is to provide a method for easily manufacturing such a light-emitting device.

According to one embodiment, a light-emitting device includes: a mounting board; a light-emitting element disposed on or above the mounting board; a plate-shaped light-transmissive member having: a first surface and a second surface facing a light-emitting surface of the light-emitting element; a light-reflective member covering a lateral surface of the light-emitting element and a lateral surface of the light-transmissive member; and a light-shielding frame on an upper surface of the light-reflective member around the light-transmissive member. The light-shielding frame has an opening. An inner perimeter of the opening has at least one notch and is located apart from outer perimeters of the first surface and the second surface of the light-transmissive member in a top plan view. The light-reflective member is disposed between the inner perimeter of the opening and the outer perimeters of the first surface and the second surface of the light-transmissive member.

According to another embodiment, a method for manufacturing a light-emitting device includes: a mounting step of mounting a light-emitting element on or above a mounting board; a light-shielding frame placement step of placing on a sheet a light-shielding frame having an opening having at least one notch on an inner perimeter of the opening; a light-transmissive member placement step of placing in the opening a plate-shaped light-transmissive member having a first surface and a second surface opposite to the first surface, outer perimeters of which are smaller than the inner perimeter of the opening, such that the first surface faces the sheet and such that a gap is formed between the light-transmissive member and the opening; a light-guiding supporting member formation step of producing a light-guiding supporting member in which a first light-reflective member supports the light-shielding frame and the light-transmissive member, the first light-reflective member being formed by pouring a first light-reflective resin into the gap through the notch; a light-guiding supporting member bonding step of fixing the light-guiding supporting member on or above the mounted light-emitting element by bonding the second surface to an upper surface of the light-emitting element; and a second light-reflective member formation step of forming a second light-reflective member surrounding the light-emitting element by filling a second light-reflective resin into a space between the mounting board and the light-shielding frame.

With the light-emitting device according to certain embodiments of the present invention, the difference in luminance between the inside and the outside of the light exit surface can be increased. Such a light-emitting device can be easily manufactured by the method for manufacturing a light-emitting device of the embodiment according to certain embodiments of the present invention.

DETAILED DESCRIPTION

Figure 1A:
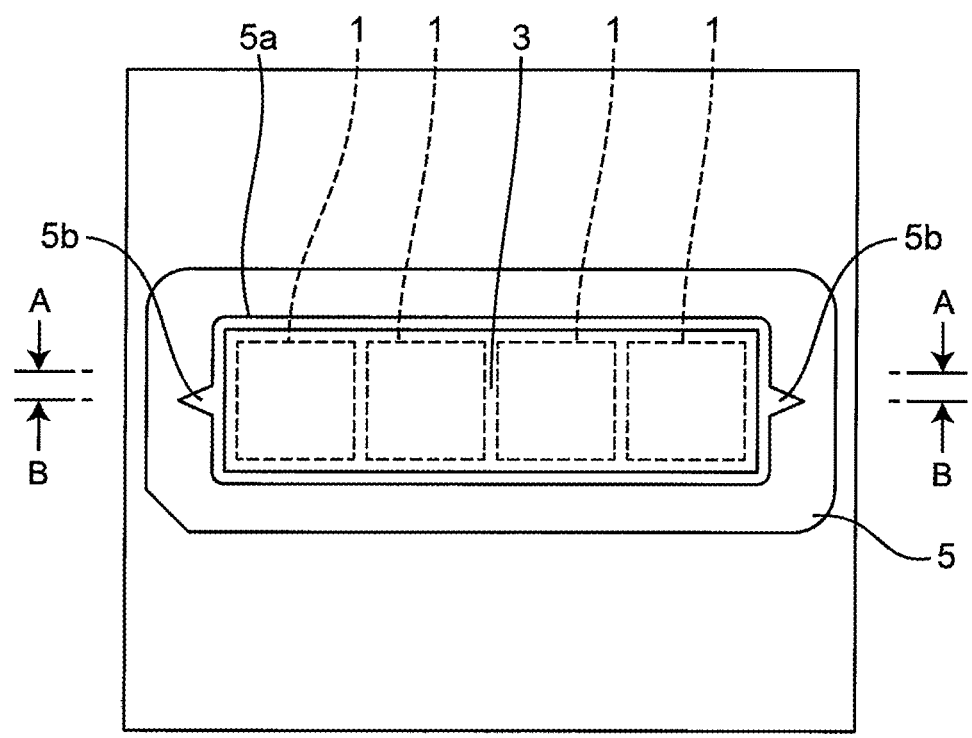
FIG. 1A is a schematic plan view of an example of a light-emitting device manufactured by a method for manufacturing a light-emitting device according to an embodiment.

Certain embodiments of a light-emitting device and a method of manufacturing the light emitting device are described below with reference to the accompanying drawings. The embodiments described below are intended to embody the technical concepts of the present invention, but the scope of the present invention is not limited to the described embodiments. The drawings referred to in the description below schematically illustrate embodiments of the present invention. The scales, the distances, the positional relations, and the like of members may be exaggerated, or illustration of part of the members may be omitted.

Light-Emitting Device of Embodiment

As shown in FIG. 1A to FIG. 4, the light-emitting device of one embodiment includes a mounting board 10, light-emitting elements 1 disposed on or above the mounting board 10, a plate-shaped light-transmissive member 3 that has a first surface and a second surface and is disposed such that the second surface faces the light-emitting surfaces of the light-emitting elements 1, a light-reflective member 9 covering the lateral surfaces of the light-emitting elements 1 and the lateral surfaces of the light-transmissive member 3, and a light-shielding frame 5 disposed on the upper surface of the light-reflective member 9 around the light-transmissive member 3. The light-shielding frame 5 has an opening 5a and surrounds a light exit surface of the light-emitting device through the light-reflective member and a first light-reflective member 9a, a first surface 3a of the light-transmissive member 3 constituting the light exit surface and the first surface 3a being exposed from the light-reflective member and the first light-reflective member 9a. That is, the first light-reflective member 9a is disposed between the opening 5a of the light-shielding frame 5 and the light-transmissive member 3. A second light-reflective member 9b is disposed between the first light-reflective member 9a and the mounting board 10 to cover the lateral surfaces of the light-emitting elements 1. The first light-reflective member 9a and the second light-reflective member 9b may be collectively referred to as the "light-reflective member 9".

As described above, in the light-emitting device of the present embodiment, the first surface 3a of the light-transmissive member 3 is located inside the opening 5a of the light-shielding frame 5, and the first surface 3a of the light-transmissive member 3 is exposed from the first light-reflective member 9a and the light-shielding frame 5.

In particular, in the light-emitting device of the present embodiment, the inner perimeter of the opening 5a is located apart from the outer perimeter of the first surface 3a of the light-transmissive member 3 constituting the light exit surface of the light-emitting device, and the first light-reflective member 9a is exposed between the inner perimeter of the opening 5a and the outer perimeter of the first surface 3a, in a plan view from above (in other words, from the light exit surface of the light-emitting device). As described above, on the upper surface of the light-emitting device, the light-transmissive member 3 is separated from the light-shielding frame 5 with the surface of the first light-reflective member 9a disposed between, and the lateral surfaces of the light-emitting elements 1 and the lateral surfaces of the light-transmissive member 3 are separated from the light-shielding frame 5 with the light-reflective member disposed between.

Figure 1B:
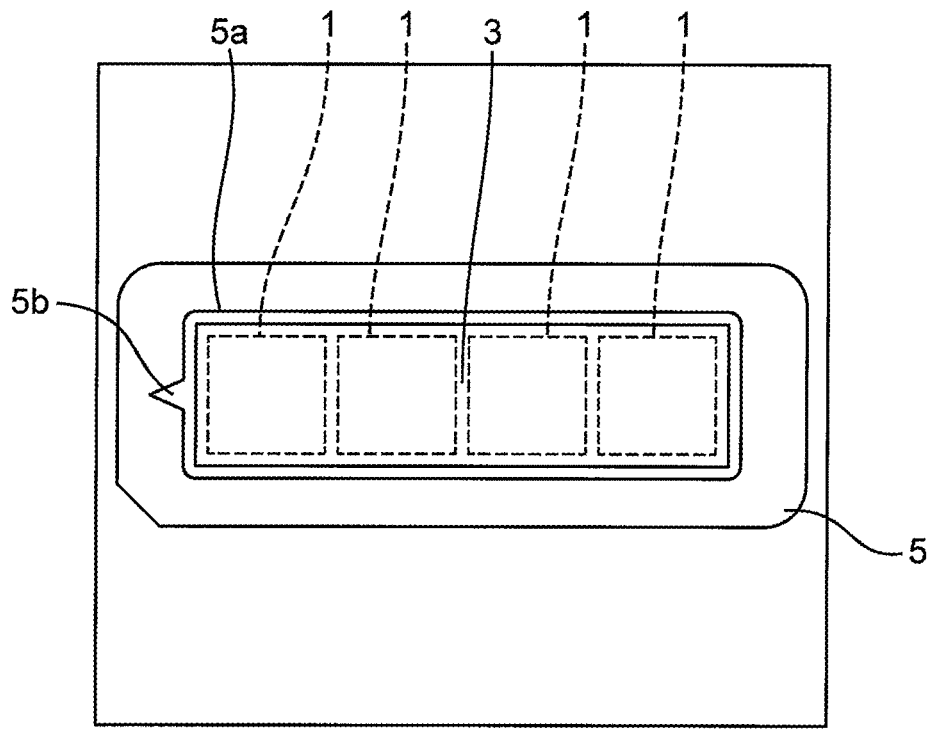
FIG. 1B is a schematic plan view of an example of a light-emitting device manufactured by the method for manufacturing a light-emitting device according to the embodiment.

As shown in FIG. 1A and FIG. 1B, the inner perimeter of the opening 5a of the light-shielding frame 5 has at least one notch 5b. Such a notch 5b allows the first light-reflective member 9a to be poured through the notch 5b into the gap between the inner perimeter of the opening 5a of the light-shielding frame 5 and the light-transmissive member 3. The notch 5b can be used as an alignment mark for alignment of the light-transmissive member 3 with the light-shielding frame and alignment of the light-guiding supporting member in which the light-shielding frame and the light-transmissive member are supported by the light-reflective member with the light-emitting elements 1. The notch 5b can also be used as a mark indicating the direction of current through the light-emitting device.

In the present specification, a notch is, for example, a wedge-shaped portion that appears to be cut off from the inner perimeter of the opening toward the outer perimeter, or a portion that appears to be simply cut out in the inner perimeter of the opening of the light-shielding frame 5 in a plan view, regardless of how the notch is made.

For example, the position, number, shape, and size of the notch 5b on the inner perimeter of the opening 5a of the light-shielding frame 5 may be appropriately adjusted in consideration of the design of the light-emitting device, and manufacturing conditions described below. In view of distinguishability of the light-emitting device, the notch 5b is preferably made in a portion other than a portion in which distinguishability is important. The distinguishability in the present specification refers to that the difference in luminance between the inside and the outside of the light exit surface is large.

For example, in the case in which the opening 5a of the light-shielding frame 5 is substantially rectangular, one notch 5b may be made on only one side of the rectangle, or one notch 5b may be made on each of two opposite sides of the rectangle. For example, in the case in which the opening 5a of the light-shielding frame 5 has a rectangular shape having long sides and short sides as shown in FIG. 1A and FIG. 1B, it is preferable to regard distinguishability on the long sides as important and to make the notch(es) on the short side(s) other than the long sides. In this case, both short sides may each have a notch as shown in FIG. 1A, or only one short side may have a notch 5b as shown in FIG. 1B.

In the case in which the opening 5a of the light-shielding frame 5 is substantially rectangular, the corners of the rectangle are preferably rounded off as shown in FIG. 1A and FIG. 1B. This structure enables the distance between the periphery of the light-transmissive member 3 and the inner lateral surfaces of the opening of the light-shielding frame to be kept substantially constant when combined with a rectangular light-transmissive member 3, so that an uncured resin material constituting the first light-reflective member described below can smoothly flow even in the corners.

In the light-emitting device of the present embodiment, the notch 5b is filled with the light-reflective member. For example, the notch 5b is filled with the first light-reflective member 9a as shown in FIG. 2B, which is a schematic cross-sectional view of an example taken along the line B-B of FIG. 1A.

In addition, for example, the outer perimeters of the first surface 3a and the second surface 3b of the light-transmissive member 3 are located inside the inner perimeter of the opening 5a of the light-shielding frame 5 in a plan view from above as shown in FIG. 1A and FIG. 1B. The lateral surfaces of the light-transmissive member 3 are, for example, substantially rectangular as shown in FIG. 2A to FIG. 4. However, the lateral surfaces of the light-transmissive member 3 may have height differences such that a flange with a uniform thickness is formed, or part or all of the lateral surfaces may be inclined. In the case in which the lateral surfaces of the light-transmissive member 3 include an inclined surface, the inclined surface may be either flat or curved.

The light extraction efficiency is enhanced by disposing the entire outer perimeters of the first surface 3a and the second surface 3b of the light-transmissive member 3 inside the inner perimeter of the opening 5a in a plan view from above as described above.

The light-emitting device of the embodiment having the above structure shows a large difference in luminance between the light exit surface and the area surrounding the light exit surface and efficiently outputs light emitted from the light-emitting elements.

In the light-emitting device of the present embodiment, the distance between the inner perimeter of the opening 5a and the outer perimeter of the light exit surface 3a is preferably 5 μm to 150 μm, more preferably 40 μm to 60 μm, in order to achieve both of increase in the difference in luminance between the inside and the outside of the light exit surface 3a and efficient extraction of light emitted from the light-emitting elements.

The following describes various modes of the light-emitting device of the present embodiment.

In a mode of the light-emitting device of the present embodiment, the area of the second surface 3b of the light-transmissive member 3 may be larger than the area of the first surface (practically the light exit surface of the light-emitting device) 3a of the light-transmissive member 3 in a plan view.

If the first surface 3a of the light-transmissive member 3 is smaller in area than the second surface 3b, light that is emitted from the light-emitting elements 1 and that is incident on the second surface 3b of the light-transmissive member 3 is radiated from the first surface 3a having a smaller area. In other words, the area of the light-emitting surface is narrowed down through the light-transmissive member 3, so that a more distant place is illuminated at high luminance. Light-emitting devices having high front luminance are particularly suitable for vehicle lights, such as headlights. There are various regulations for the colors of vehicle lights, such as a regulation that the colors of all headlights must be the same and must be white or pale yellow.

In a mode of the light-emitting device of the present embodiment, the outer perimeter of the first surface 3a of the light-transmissive member 3 may be located outside the outer perimeter of the light-emitting elements 1 in a plan view from above as shown in FIG. 1A and FIG. 1B. The entire light-emitting surfaces of the light-emitting elements 1 are covered with the light-transmissive member 3 in this structure, and emission of light emitted from the light-emitting elements 1 to the outside without passing through the light-transmissive member 3 is suppressed. Accordingly, for example, there is a possibility of compromising safety of a vehicle because of infringement of the above regulation for vehicle lights if the proportion of primary light emitted from the light-emitting elements 1 to light emitted from the light-emitting surface increases in the case in which a light-emitting device that emits light having a desired color by mixing the color of the primary light emitted from the light-emitting elements 1 and the color of secondary light generated by wavelength conversion of the primary light is used as a vehicle light. As shown in FIG. 1A and FIG. 1B, in the light-emitting device that includes a plurality of light-emitting elements 1, the outer perimeter of the light-emitting elements 1 means the outer perimeter of the whole of the plurality of light-emitting elements 1 in a plan view from above and does not include portions of the outer perimeters of the individual light-emitting elements 1, the portions facing each other between adjacent light-emitting elements 1.

In another mode of the light-emitting device of the present embodiment, the outer perimeter of the first surface 3a of the light-transmissive member 3 may be located inside the outer perimeter of the light-emitting elements 1 in a plan view from above. With this structure, light emitted from a plurality of light-emitting elements 1 is condensed before being emitted through the first surface 3a of the light-transmissive member 3. Light emitted from the light-emitting elements 1 is thus emitted from the exit surface 3a at a higher luminous flux density.

As described above, the luminous flux density at the light-emitting surface of the light-emitting device is adjusted to a desired luminous flux density by appropriately selecting the area of the light-emitting surface of each light-emitting element and the area of the first surface 3a (the light-emitting surface of the light-emitting device) of the light-transmissive member 3.

Figure 2A:
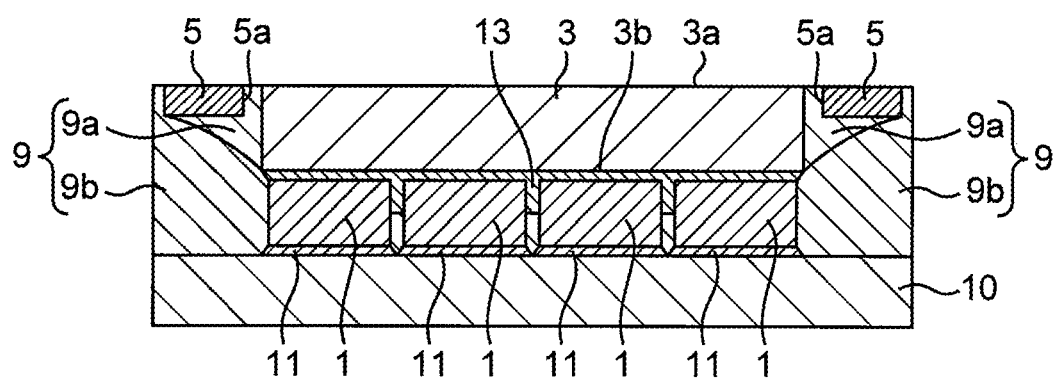
FIG. 2A is a schematic cross-sectional view of an example of the light-emitting device manufactured by the method for manufacturing a light-emitting device according to the embodiment taken along the line A-A of FIG. 1A.
Figure 2B:
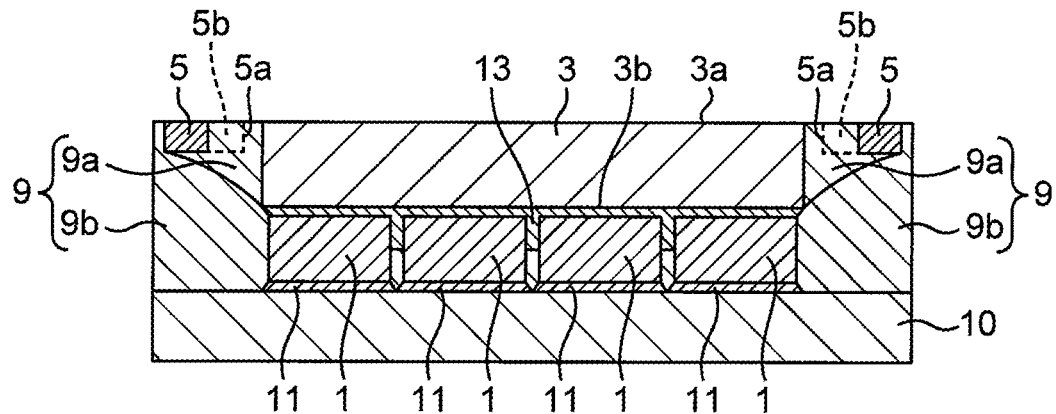
FIG. 2B is a schematic cross-sectional view of an example of the light-emitting device manufactured by the method for manufacturing a light-emitting device according to the embodiment taken along the line B-B of FIG. 1A.
Figure 3:
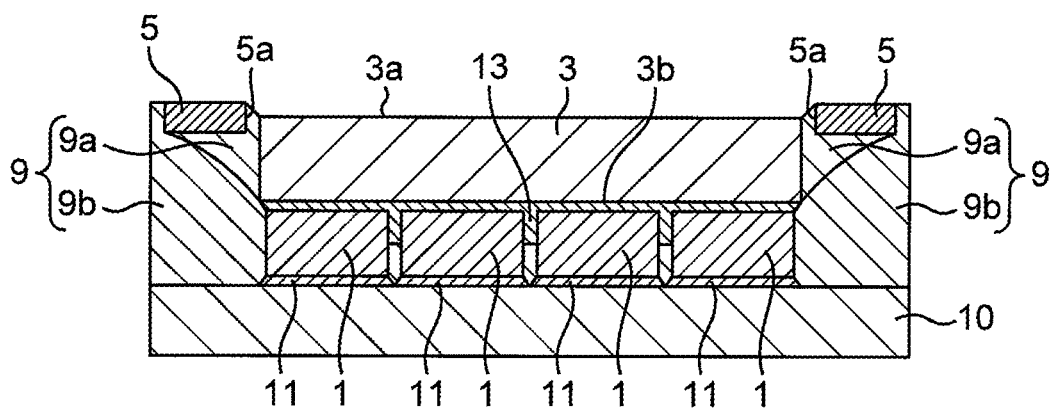
FIG. 3 is a schematic cross-sectional view of an example of a light-emitting device manufactured by the method for manufacturing a light-emitting device according to the embodiment taken along the line A-A of FIG. 1A.

In a mode of the light-emitting device of the present embodiment, the first surface 3a of the light-transmissive member 3 is located at substantially the same height as (in other words, flush with) the upper surface of the light-shielding frame 5 as shown in FIG. 2A. However, in the light-emitting device of the present embodiment, the first surface 3a may be located below the upper surface of the light-shielding frame 5 as shown in FIG. 3 or may be located above the upper surface of the light-shielding frame 5. In the case in which the first surface 3a of the light-transmissive member 3 is located below or above the upper surface of the light-shielding frame 5, the first surface 3a of the light-transmissive member 3 is preferably parallel to the upper surface of the light-shielding frame 5. Also in the case in which the first surface 3a of the light-transmissive member 3 is located below or above the upper surface of the light-shielding frame 5, the light-reflective member preferably covers the lateral surfaces of the light-emitting elements 1 and the lateral surfaces of the light-transmissive member 3 such that the first surface 3a, which is the light exit surface of the light-emitting device, of the light-transmissive member 3 is exposed. In this case, the light-reflective member preferably covers the inner perimeter of the opening of the light-shielding frame located above or below the first surface 3a of the light-transmissive member 3. The inner perimeter end surfaces of the opening of the light-shielding frame 5 may be inclined. Light-emitting devices without lateral walls 7 as shown in FIG. 2A to FIG. 3 have the advantage of being smaller than a light-emitting device including a lateral wall 7.

Figure 4:
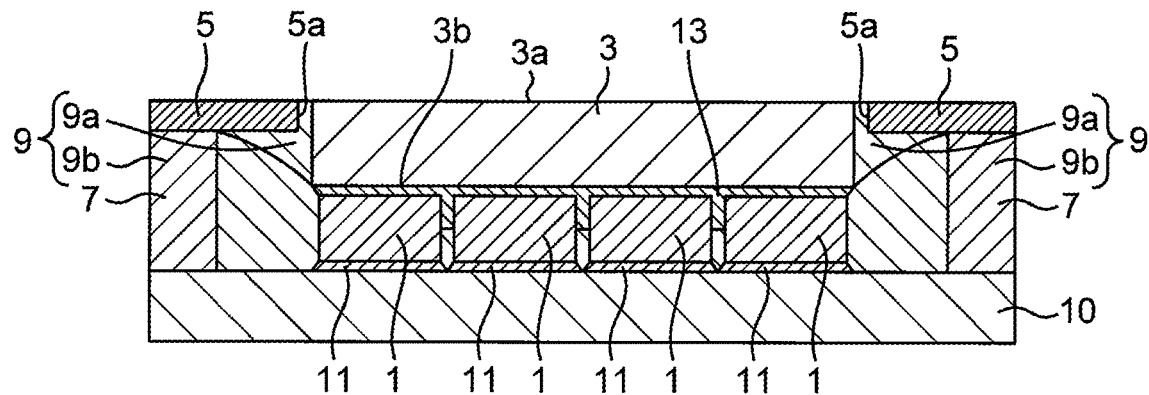
FIG. 4 is a schematic cross-sectional view of an example of a light-emitting device manufactured by the method for manufacturing a light-emitting device according to the embodiment taken along the line A-A of FIG. 1A.

In a mode of the light-emitting device of the present embodiment, a lateral wall 7 may be disposed between the mounting board 10 and the light-shielding frame 5 as shown in FIG. 4. For example, the lateral wall 7 may be disposed outside the light-reflective member so as to surround the light-reflective member, or lateral walls 7 may be disposed so as to face each other across the light-reflective member.

The following describes constituent members of the light-emitting device of the present embodiment.

(Mounting Board 10)

The mounting board 10 is a member supporting the light-emitting elements 1 and other constituents, and at least its surface is provided with wiring electrically connected to external electrodes of the light-emitting elements 1. A preferable main material of the mounting board 10 is an insulating material that is unlikely to transmit light emitted from the light-emitting elements 1 and extraneous light. Specific examples of the material include ceramics, such as alumina and aluminum nitride, and resins, such as phenolic resins, epoxy resins, silicone resins, polyimide resins, bismaleimide triazine resins, and polyphthalamide. In the case in which a resin is used, an inorganic filler, such as glass fiber, silicon oxide, titanium oxide, and alumina, may be mixed with the resin as appropriate. Such a filler can improve the mechanical strength, reduce the thermal expansion coefficient, and improve the light reflectance. The mounting board 10 may be a metal member on the surface of which an insulating material is formed. The wiring is formed into a predetermined pattern on the insulating material. The material of the wiring can be at least one selected from among gold, silver, copper, titanium, palladium, nickel, and aluminum. The wiring can be formed by plating, vacuum evaporation, sputtering, or the like.

(Light-Emitting Element 1)

A light emitting diode is preferably used as each light-emitting element 1. A light-emitting element with appropriate wavelength can be selected. Examples of a blue or green light-emitting element include a light-emitting element including a nitride semiconductor ($In_XAl_YGa_{1-X-Y}N$, where $0 \leq X$, $0 \leq Y$, and $X+Y \leq 1$), ZnSe, or GaP. For a red light-emitting element, GaAlAs, AlInGaP, or the like can be used. Semiconductor light-emitting elements made of other materials can also be used. The compositions, emission colors, sizes, and number of the light-emitting elements to be used can be selected appropriately depending on the purpose. In the case in which the light-emitting device contains a phosphor, for example, a nitride semiconductor ($In_XAl_YGa_{1-X-Y}N$, where $0 \leq X$, $0 \leq Y$, and $X+Y \leq 1$) is suitable because it can emit light with short wavelengths that can efficiently excite the phosphor. The emission wavelength can be selected by changing the materials for the semiconductor layers and their mixing ratios.

For example, the light-emitting element 1 used in the light-emitting device of the present embodiment includes positive and negative electrodes on the same surface. The light-emitting element 1 is flip-chip mounted on or above the mounting board 10 with electrically-conductive bonding members 11 therebetween as shown in FIG. 2A to FIG. 4. The light-emitting element 1 is mounted with its surface provided with the electrodes being the lower surface that faces the mounting board, and the upper surface opposite to the lower surface serves as the main light exit surface. As such a light-emitting element 1 is connected to the mounting board using electrically-conductive bonding members, such as bumps and electrically-conductive pastes, as described above, the area of contact between the electrodes and the mounting board is larger than in the case of a light-emitting element that is connected using metal wires or the like, so that the contact resistance is reduced.

The light-emitting element 1 is formed by, for example, layering a nitride semiconductor layer on a light-transmissive support substrate. The support substrate is located on the upper side of the light-emitting element 1 and constitutes the main light exit surface. The support substrate may be removed by, for example, abrasion or laser lift off.

(Light-Transmissive Member 3)

The light-transmissive member 3 transmits light emitted from the light-emitting elements 1 and radiates the light to the outside. The light-transmissive member 3 may contain a light-diffusing material and a phosphor that can perform wavelength conversion of at least part of incident light. The light-transmissive member 3 can be made of, for example, resin, glass, or an inorganic substance. Examples of the light-transmissive member containing a phosphor include sintered bodies of phosphors, and mixtures of phosphors and substances such as resin, glass, ceramics, and other inorganic substances. Alternatively, a mold or compact of resin, glass, or a ceramic on the surface of which a resin layer containing a phosphor is formed can be used. The thickness of the light-transmissive member 3 is, for example, about 50 μm to 300 μm.

The light-transmissive member 3 can be bonded to the light-emitting elements using, for example, a light guide member 13 as shown in FIG. 2A to FIG. 4. The light-transmissive member 3 may be directly bonded to the light-emitting elements 1 by compression, sintering, surface-activated bonding, atomic diffusion bonding, or hydroxy-group bonding without the light guide member 13.

(Phosphor)

As described above, the light-transmissive member 3 may contain a phosphor. A phosphor that is excited by light emitted from the light-emitting elements 1 is used as the phosphor that can be contained in the light-transmissive member 3. Examples of a phosphor that is excited by a blue or ultraviolet light-emitting element include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO-Al_2O_3-SiO_2$:Eu); europium-activated silicate phosphors (($Sr,Ba)_2SiO_4$:Eu); nitride phosphors such as β-SiAlON phosphors, CASN phosphors represented by $CaAlSiN_3$:Eu, and SCASN phosphors represented by $(Sr,Ca)AlSiN_3$:Eu; KSF phosphors represented by $K_2SiF_6$:Mn; sulfide phosphors; and quantum-dot phosphors. A combination of such a phosphor and a blue or ultraviolet light-emitting element enables manufacturing of a light-emitting device (such as a light-emitting device emitting white light) that emits light having a desired color.

(Light-Shielding Frame 5)

The light-shielding frame 5 is disposed in order to reduce the luminance of the portion other than the light exit surface in the upper surface of the light-emitting device. To reduce the luminance of the portion other than the light exit surface, light leaking out from the portion other than the first surface 3a of the light-transmissive member 3 to the outside is required to be blocked. Considering this function, the light-shielding frame 5 is preferably constituted of, for example, a member made of a material that reflects and/or absorbs light without transmitting light or a member provided with, on its surface, a film made of a material that reflects and/or absorbs light.

The inner perimeter of the opening 5a of the light-shielding frame 5 has at least one notch 5b. As the notch 5b is made on the inner perimeter of the opening 5a of the light-shielding frame 5, the notch 5b can be used as an alignment mark when the center of the light-emitting surface is to be recognized on the light-emitting surface of the light-emitting device as described above. In addition, as described below in detail, the light-guiding supporting member is efficiently formed by pouring a light-reflective resin into the gap between the light-transmissive member and the opening of the light-shielding frame through the notch 5b.

For example, the material constituting the light-shielding frame 5 can be selected from among resins (including fiber-reinforced resins), ceramics, glass, paper, metals, and composite materials each made of two or more of these materials. Specifically, the light-shielding frame 5 is preferably made of a material that has good light-blocking properties and is unlikely to deteriorate. For example, the light-shielding frame 5 may be constituted of a metal frame made of metal or a frame provided with a metal film on its surface. Examples of the metal material include copper, iron, nickel, chromium, aluminum, gold, silver, titanium, and alloys of these metals. In particular, a metal frame made of a weather- and moisture-resistant material, such as stainless steel and aluminum, is preferably used.

The light-shielding frame 5 more preferably has the function of suppressing reflection of extraneous light in addition to the function of suppressing leakage of light from inside the light-emitting device. To achieve the function of suppressing reflection of extraneous light, for example, minute irregularities may be provided on the surface at the light exit surface, or a material with high light absorptivity may be used. The arithmetic mean roughness Ra of the minute irregularities is, for example, 0.5 µm to 1.0 µm. In the case in which the surface of the light-shielding frame has minute irregularities, wettability of the surface of the light-shielding frame by a liquid is enhanced, and the uncured resin material tends to spread over the surface of the light-shielding frame. Hence, for example, the minute irregularities are preferably not formed on the edges of the upper surface of the light-shielding frame.

The thickness of the light-shielding frame 5 (that is, the height from the lower surface to the upper surface of the light-shielding frame 5) is preferably about 20 µm to 200 µm, more preferably about 30 µm to 80 µm, in consideration of the lightness and resistance to deformation as well as the strength when used as the light-emitting device.

The light-shielding frame 5 may be disposed such that the outer perimeter of the light-shielding frame 5 coincides with the outer perimeter of the light-emitting device in a plan view, but it is preferable that the outer perimeter of the light-shielding frame 5 be located inside the outer perimeter of the light-emitting device. This structure suppresses misalignment and the like of the light-shielding frame 5 in a division step of dividing light-emitting devices into unit areas (that is, individual light-emitting devices) described below, because the light-shielding frame 5 is not disposed on the dividing lines.

The statement that the light-shielding frame 5 is disposed such that the outer perimeter of the light-shielding frame 5 is located inside the outer perimeter of the light-emitting device includes the state in which the light-shielding frame 5 is disposed such that part of the outer perimeter of the light-shielding frame 5 is located inside the outer perimeter of the light-emitting device.

The width of the light-shielding frame 5 in a plan view is preferably 130 µm or more in consideration of increase in the difference in luminance between the inside and the outside of the light exit surface 3a. The width is more preferably 500 µm or more in consideration of the ease of handling in the manufacturing process. The width of the light-shielding frame 5 may be uniform over the whole perimeter or may be partially different. In the case in which the width of the light-shielding frame 5 is partially different, it is more preferable that at least the width be 130 µm or more over the whole perimeter and be partially 500 µm or more. (First Light-Reflective Member 9a and Second Light-Reflective Member 9b)

The light-reflective member, that is, the first light-reflective member 9a and the second light-reflective member 9b, covers the lateral surfaces of the light-emitting elements 1 and the lateral surfaces of the light-transmissive member 3 and reflects light emitted from the lateral surfaces of the light-emitting elements 1 and the lateral surfaces of the light-transmissive member 3 to allow the light to be emitted from the light-emitting surface. The light extraction efficiency is enhanced by disposing the light-reflective member covering the lateral surfaces of the light-emitting elements 1 and the lateral surfaces of the light-transmissive member 3 as described above. The light-reflective member is made of, for example, a light-reflective material having a high light reflectance. Specifically, a light-reflective material having a reflectance with respect to light emitted from the light-emitting elements of 60% or more, more preferably 80% or 90% or more, can be used for the light-reflective member. The light-reflective material includes, for example, a resin material containing a light-reflective substance. As described below in detail, the first light-reflective member 9a and the second light-reflective member 9b are formed separately and may be made of different light-reflective materials or the same light-reflective material.

Examples of resins serving as base materials constituting a first light-reflective resin 9c that forms the first light-reflective member 9a and a second light-reflective resin 9d that forms the second light-reflective member 9b include silicone resins, modified silicone resins, epoxy resins, modified epoxy resins, acrylic resins, and hybrid resins each containing at least one of these resins. A light-reflective substance can be mixed in the resin base material. Examples of the light-reflective substance include titanium oxide, silicon oxide, zirconium oxide, magnesium oxide, yttrium oxide, yttria-stabilized zirconia, calcium carbonate, calcium hydroxide, calcium silicate, niobium oxide, zinc oxide, barium titanate, potassium titanate, magnesium fluoride, alumina, aluminum nitride, boron nitride, and mullite. Titanium oxide ($TiO_2$) is preferable. It is preferable that particles having a refractive index different from the refractive index of the base resin be dispersed as the light-reflective substance in the base resin. As the amounts of reflection and transmission of light vary depending on the concentration and density of the light-reflective substance, the concentration and density can be appropriately adjusted depending on the shape and size of the light-emitting device. The light-reflective member may contain another pigment, phosphor, and the like in addition to the light-reflective substance. In particular, in the case in which the light-transmissive member 3 contains a phosphor, incorporating a similar phosphor into the second light-reflective resin 9d prevents leakage of light emitted from the light-emitting elements from being visually recognized from the lateral surfaces of the light-emitting device.

(Light Guide Member 13)

In the light-emitting device, the light-transmissive member 3 is bonded to the light-emitting elements using, for example, the light guide member 13 as described above. The light guide member 13 may cover part or the whole of the lateral surfaces of the light-emitting elements 1 as shown in FIG. 2A to FIG. 4. In the case in which part of the second surface 3b of the light-transmissive member 3 does not face the upper surfaces, which are the main light exit surfaces, of the light-emitting elements 1, the light guide member 13 preferably covers the part of the light-transmissive member 3 that does not face the upper surfaces of the light-emitting elements. The light guide member 13 is also disposed between the light-emitting elements and the light-transmissive member 3 and bonds the light-emitting elements and the light-transmissive member 3. The light guide member 13 having the above structure efficiently guides light emitted from the upper surfaces and the lateral surfaces of the light-emitting elements 1 to the light-transmissive member 3.

The light guide member 13 is preferably made of a resin material because resin materials are easy to handle and process. A resin material made of a resin or hybrid resin containing at least one of silicone resins, modified silicone resins, epoxy resins, modified epoxy resins, acrylic resins, and fluorocarbon resins can be used as the resin material. The light guide member 13 can be formed into the above shape by appropriately adjusting the viscosity of the resin material constituting the light guide member 13 and the wettability of the light-emitting elements 1 by the resin material.

(Other Members)

The light-emitting device may freely include other elements such as a protective element and electronic components. These elements and electronic components are preferably embedded in the light-reflective member.

<Method for Manufacturing Light-Emitting Device of Embodiment>

A method for manufacturing a light-emitting device of one embodiment includes: a mounting step of mounting a light-emitting element on or above a mounting board; a light-shielding frame placement step of placing on a sheet a light-shielding frame having an opening having at least one notch on an inner perimeter of the opening; a light-transmissive member placement step of placing in the opening a plate-shaped light-transmissive member having a first surface and a second surface opposite to the first surface, outer perimeters of which are smaller than the inner perimeter of the opening, such that the first surface faces the sheet and such that a gap is formed between the light-transmissive member and the opening; a light-guiding supporting member formation step of producing a light-guiding supporting member in which a first light-reflective member supports the light-shielding frame and the light-transmissive member, the first light-reflective member being formed by pouring a first light-reflective resin into the gap through the notch; a light-guiding supporting member bonding step of fixing the light-guiding supporting member on or above the mounted light-emitting element by bonding the second surface to an upper surface of the light-emitting element; and a second light-reflective member formation step of forming a second light-reflective member surrounding the light-emitting element by filling a second light-reflective resin into a space between the mounting board and the light-shielding frame.

The method for manufacturing a light-emitting device of the present embodiment is described referring to the accompanying drawings.

(Mounting Step)

Figure 5A:
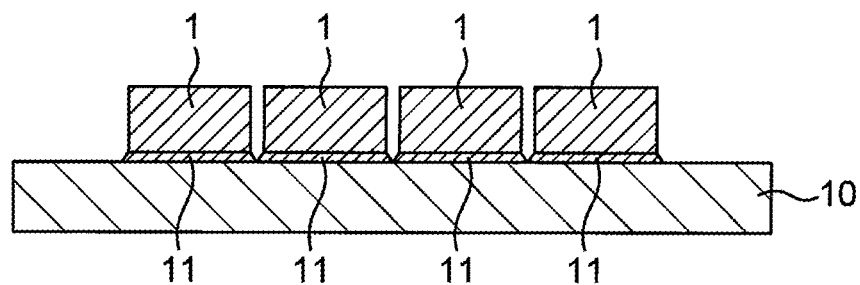
FIG. 5A is a schematic cross-sectional view when light-emitting elements are mounted in the method for manufacturing a light-emitting device of the embodiment.

In this step, the light-emitting element(s) 1 is flip-chip mounted on or above the mounting board 10 as shown in FIG. 5A.

In the case in which the light-emitting device includes a plurality of light-emitting elements 1, the light-emitting elements 1 are preferably aligned closely to each other.

(Light-Shielding Frame Placement Step)

Figure 5B:
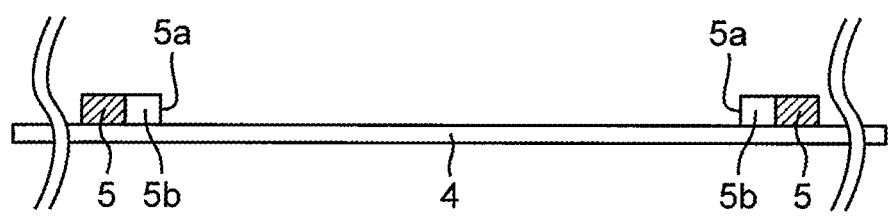
FIG. 5B is a schematic cross-sectional view when a light-shielding frame is placed on a sheet in the method for manufacturing a light-emitting device of the embodiment.

In this step, a sheet 4 and the light-shielding frame 5 having the opening 5a having the notch 5b on the inner perimeter of the opening 5a are provided, and the light-shielding frame 5 is placed on the sheet 4 as shown in FIG. 5B.

A plurality of light-shielding frames 5 preliminarily formed into a desired shape may be provided and each disposed on the sheet 4, or a light-shielding frame 5 in which a plurality of light-shielding frames 5 corresponding to unit areas are connected to each other in the row direction and/or the column direction may be provided and collectively disposed on the sheet 4. A heat resistant sheet having an adhesive surface is preferably used as the sheet 4. The base member of the sheet 4 is, for example, a polyimide.

(Light-Transmissive Member Placement Step)

Figure 5C:
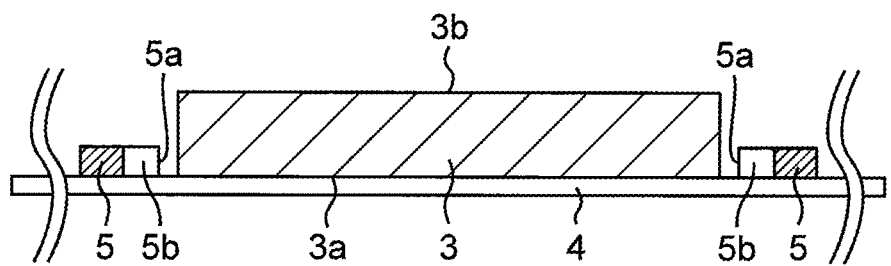
FIG. 5C is a schematic cross-sectional view when a light-transmissive member is placed on the sheet in the method for manufacturing a light-emitting device of the embodiment.
Figure 5D:
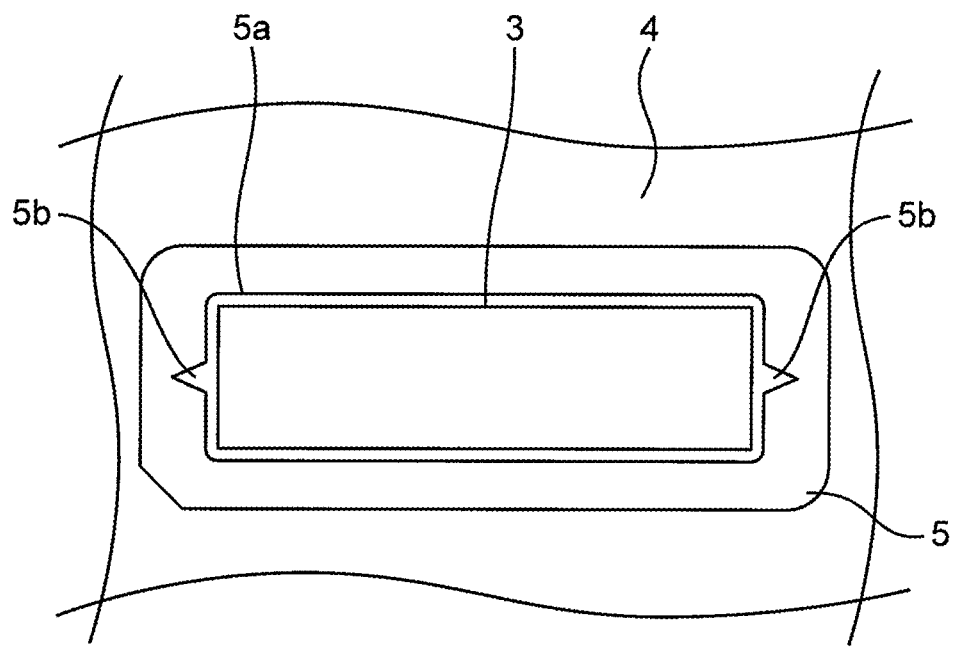
FIG. 5D is a schematic plan view when the light-transmissive member is placed on the sheet in the method for manufacturing a light-emitting device of the embodiment.

In this step, the plate-shaped light-transmissive member 3 having the first surface 3a and the second surface 3b opposite to the first surface 3a in which the outer perimeter of the first surface 3a is smaller than the inner perimeter of the opening 5a of the light-shielding frame 5 is used, and the light-transmissive member 3 is placed in the opening 5a such that the first surface 3a of the light-transmissive member 3 faces the sheet and such that the gap is formed between the light-transmissive member 3 and the opening 5a of the light-shielding frame 5 as shown in FIG. 5C and FIG. 5D.

Specifically, for example, the light-transmissive member 3 is picked up with a suction collet and aligned such that the inner perimeter of the opening 5a of the light-shielding frame 5 is located outside the outer perimeter of the first surface 3a of the light-transmissive member, and the suction collet is moved downward to place the light-transmissive member 3 on the sheet 4.

(Light-Guiding Supporting Member Formation Step)

Figure 5E:
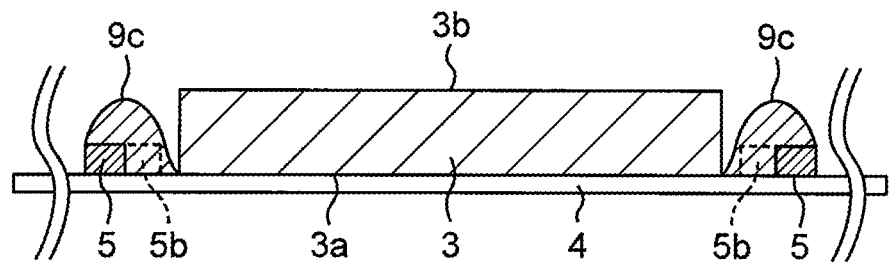
FIG. 5E is a schematic cross-sectional view after a first light-reflective resin is applied in notches of the light-shielding frame in the method for manufacturing a light-emitting device of the embodiment.
Figure 5F:
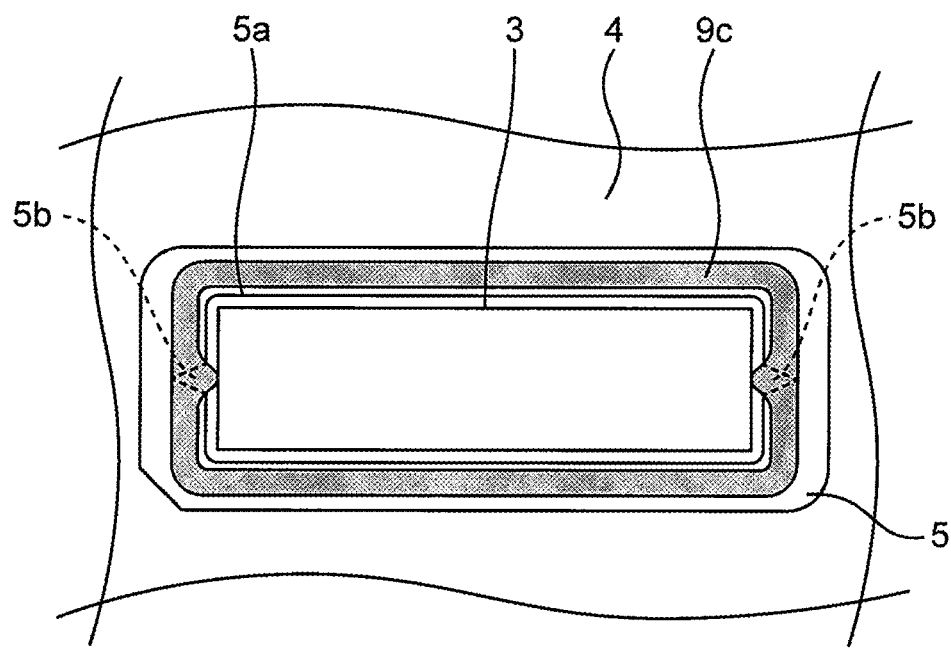
FIG. 5F is a schematic plan view after the first light-reflective resin is applied in the notches of the light-shielding frame in the method for manufacturing a light-emitting device of the embodiment.
Figure 5G:
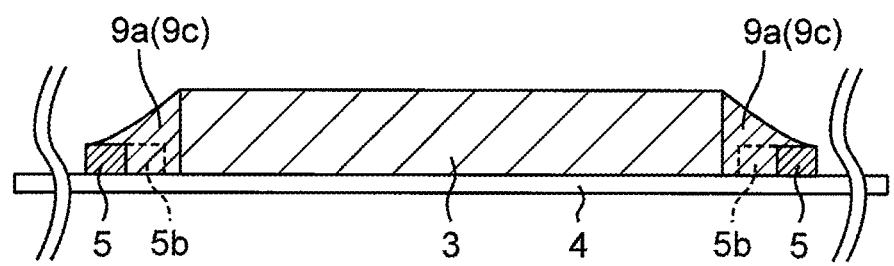
FIG. 5G is a schematic cross-sectional view when a light-guiding supporting member is formed in the method for manufacturing a light-emitting device of the embodiment.
Figure 5H:
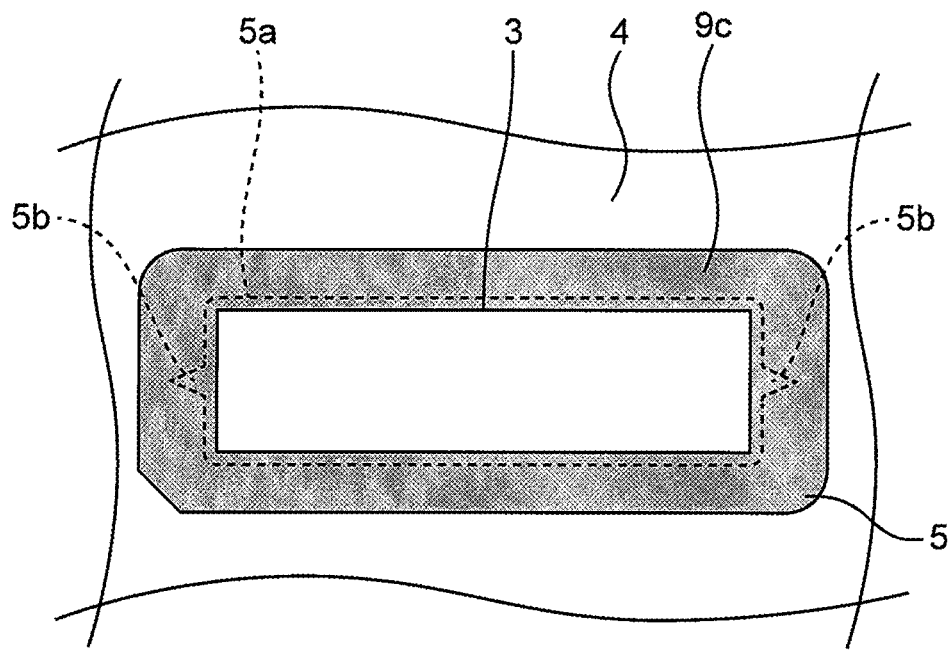
FIG. 5H is a schematic plan view when the light-guiding supporting member is formed in the method for manufacturing a light-emitting device of the embodiment.
Figure 5I:
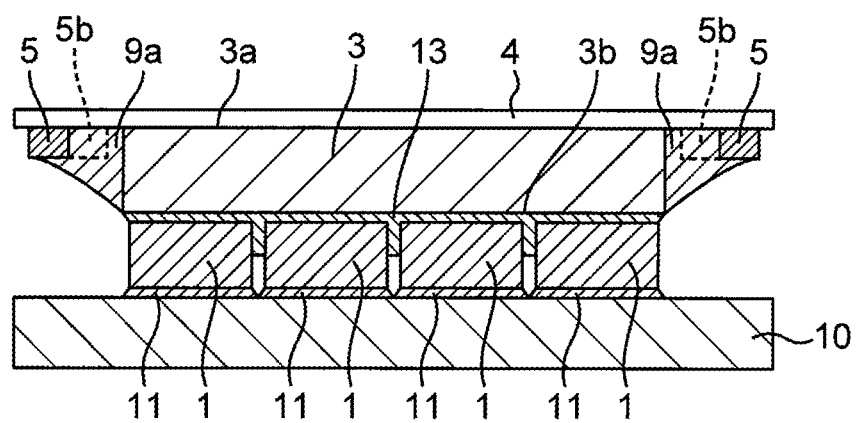
FIG. 5I is a schematic cross-sectional view when the light-guiding supporting member is fixed on or above the light-emitting elements in the method for manufacturing a light-emitting device of the embodiment.

In this step, the first light-reflective resin 9c is poured into the gap between the light-transmissive member 3 and the opening 5a of the light-shielding frame 5 to form the first light-reflective member 9a, so that the light-guiding supporting member in which the light-shielding frame 5 and the light-transmissive member 3 are supported by the first light-reflective member 9a is produced as shown in FIGS. 5G and 5H.

Specifically, the first light-reflective resin 9c is applied on the notch 5b of the light-shielding frame 5 as shown in FIGS. 5E and 5F. As described above, the first light-reflective resin 9c is poured through the notch into the comparatively narrow gap (clearance) between the light-transmissive member 3 and the opening 5a of the light-shielding frame 5. That is, the first light-reflective resin 9c flows into the comparatively narrow gap (clearance) between the light-transmissive member 3 and the opening 5a of the light-shielding frame 5 utilizing the capillary action starting from the notch 5b. The first light-reflective resin 9c can be efficiently poured into the gap by allowing the first light-reflective resin 9c to flow in the gap between the light-shielding frame 5 and the light-transmissive member 3 to cover the inner lateral surfaces of the opening 5a of the light-shielding frame 5 and the lateral surfaces of the light-transmissive member 3 to fill the gap as described above. The viscosity and the like of the first light-reflective resin 9c is appropriately selected in consideration of the distance between the inner lateral surfaces of the opening 5a of the light-shielding frame 5 and the lateral surfaces of the light-transmissive member 3 in view of facilitating movement of the first light-reflective resin 9c by the capillary action as described above. The gap between the light-shielding frame 5 and the light-transmissive member 3 is preferably narrow.

The position, number, shape, and size of the notch 5b on the inner perimeter of the opening 5a of the light-shielding frame 5 are appropriately adjusted in consideration of the design of the light-emitting device and manufacturing conditions as described above.

The opening 5a of the light-shielding frame 5 preferably has a plurality of notches 5b in view of enhancement in the manufacturing speed by more quickly pouring the first light-reflective resin 9c into the gap between the light-shielding frame 5 and the light-transmissive member 3. In the case in which a plurality of notches 5b are provided, the shapes, sizes, positions, and the like of the notches 5b are appropriately selected in view of more efficiently pouring the first light-reflective resin 9c into the gap between the light-shielding frame 5 and the light-transmissive member 3. For example, in the case in which the opening 5a of the light-shielding frame 5 has a rectangular shape having long sides and short sides as shown in FIG. 1A, two opposite sides, such as both short sides as shown in FIG. 1A, each have one notch. By making two notches 5b at such positions, the first light-reflective resin 9c is more efficiently poured into the gap between the light-shielding frame 5 and the light-transmissive member 3 than in the case in which two notches 5b are made on the same side because the first light-reflective resin 9c flows at a time through the two notches 5b located somewhat apart from each other.

In view of easily pouring the first light-reflective resin 9c through the notches 5b, the shape of each notch 5b is, for example, substantially triangular or substantially semicircular. In the case in which the shape of the notch 5b is substantially triangular, the interior angle of the triangular vertex with the inner lateral surface of the light-shielding frame being the base is, for example, an acute angle in the range of 25° to 90°. In the case in which the shape of the notch 5b is substantially semicircular, the substantially semicircular shape preferably passes through the above triangular vertex. The notch having such a shape allows the first light-reflective resin 9c to be effectively poured utilizing the capillary action.

To further facilitate pouring of the first light-reflective resin 9c through the notch 5b, the lateral surface of the notch 5b may be inclined, or the surface opposite to the light-emitting surface may have a convex or concave shape.

The first light-reflective resin 9c can be, for example, applied on the light-shielding frame 5 by discharging the resin from the tip of a nozzle of a resin discharging device. For example, the first light-reflective resin 9c can be applied in the form of a frame surrounding the opening of the light-shielding frame 5 along the opening or may be applied in a line or in dots along the opening.

The amount of the first light-reflective resin 9c to be applied is preferably such that the first light-reflective member 9a is fully formed in the gap between the light-transmissive member 3 and the light-shielding frame 5. The amount and the viscosity of the first light-reflective resin 9c to be applied are preferably adjusted such that the first light-reflective resin 9c does not adhere to the first surface 3a of the light-transmissive member 3 so as not to hinder radiation of light from the first surface 3a, which serves as the light-emitting surface of the light-emitting device, of the light-transmissive member 3.

The viscosity of the uncured first light-reflective resin 9c is preferably, for example, 5 Pa·s to 15 Pa·s. If a resin material with a low viscosity is used, the flow of the resin material into finer portions is ensured while suppressing generation of voids and the like.

After filling the gap between the light-transmissive member 3 and the opening 5a of the light-shielding frame 5 with the first light-reflective resin 9c, the first light-reflective resin 9c is cured to form the first light-reflective member 9a. The light-guiding supporting member in which the light-shielding frame 5 and the light-transmissive member 3 are supported by the first light-reflective member 9a can be thus produced as shown in FIG. 5E.

(Light-Guiding Supporting Member Bonding Step)

In this step, the light-guiding supporting member is fixed on or above the light-emitting elements 1 by bonding the second surface 3b of the light-transmissive member 3 to the light-emitting surfaces (in other words, the upper surfaces) of the mounted light-emitting elements 1 as shown in FIG. 5F.

The light-transmissive member 3 of the light-guiding supporting member obtained as described above is aligned with the light-emitting elements 1, and the light-transmissive member 3 is bonded to the light-emitting surfaces of the light-emitting elements 1 with, for example, the light guide member 13.

The light-guiding supporting member is aligned such that, for example, (i) the outer perimeter of the second surface 3b of the light-transmissive member 3 is located outside the outer perimeter of the light-emitting elements 1 in a plan view from above, and (ii) the outer perimeter of the first surface 3a of the light-transmissive member 3 is located outside the outer perimeter of the light-emitting elements 1 in a plan view from above.

When the light-transmissive member 3 of the light-guiding supporting member is to be bonded to the light-emitting elements 1, the light guide member 13 may be preliminarily applied on the second surface 3b before the light-transmissive member 3 is placed on or above the light-emitting elements 1, or the light guide member 13 may be applied on the upper surfaces of the light-emitting elements 1 before the light-transmissive member 3 of the light-guiding supporting member is placed on or above the light-emitting elements 1. The amount of the light guide member 13 to be applied, the load when the light-transmissive member 3 is placed on or above the light-emitting elements 1 and pressed, and in the case in which a resin material is used as the light guide member 13, the viscosity of the resin material when being applied, may be appropriately selected in consideration of a desired shape of the light guide member 13 after the light-transmissive member 3 of the light-guiding supporting member is bonded to the light-emitting elements 1.

(Sheet Removal Step)

The manufacturing method of the present embodiment may include a sheet removal step of removing the sheet 4.

The sheet 4 may be removed after the light-guiding supporting member bonding step or after the second light-reflective member formation step described later.

(Second Light-Reflective Member Formation Step)

Figure 5J:
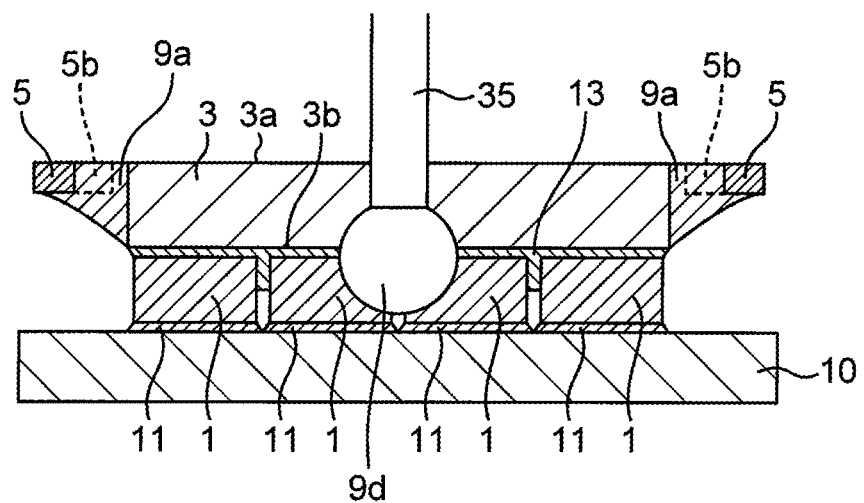
FIG. 5J is a schematic cross-sectional view showing filling of a light-reflective resin in the method for manufacturing a light-emitting device of the embodiment.

In this step, the uncured second light-reflective resin 9d constituting the second light-reflective member 9b is filled into the space between the mounting board 10 and the light-shielding frame 5 to form the light-reflective member (in other words, the first light-reflective member 9a and the second light-reflective member 9b) surrounding the light-emitting elements 1 and the light-transmissive member 3 between the mounting board 10 and the light-shielding frame 5. In the method for manufacturing a light-emitting device of the present embodiment, for example, a light-shielding frame 5 having a size smaller than that of the mounting board 10 (in other words, such a size that the periphery of the light-shielding frame 5 is encompassed by the mounting board 10 in a plan view) is used, and the second light-reflective resin 9d is filled into the space between the mounting board 10 and the light-shielding frame 5 from the outer perimeter of the light-shielding frame. FIG. 5J shows an example in which the sheet 4 is removed before the second light-reflective member formation step.

After the second light-reflective resin 9d is filled into the space between the mounting board 10 and the light-shielding frame 5, the filled second light-reflective resin 9d is cured.

The light-emitting device of the present embodiment is manufactured as described above.

(Other Steps)

In the light-emitting device of the present embodiment, the lateral wall 7 may be disposed between the mounting board 10 and the light-shielding frame 5 as shown in FIG. 4. In the case in which such a light-emitting device is to be manufactured, the lateral wall 7 with a predetermined height is formed on the light-shielding frame 5 and/or on the mounting board 10 before the light-guiding supporting member bonding step. For example, the lateral wall 7 can be made of a resin material with a viscosity enough to hold its shape between the mounting board 10 and the light-shielding frame 5. In this case, the resin material constituting the lateral wall 7 is not completely cured to maintain a sufficient flexibility to allow deformation by pressing.

Curing is performed in the state in which the lateral wall 7 made of the uncured resin material is disposed between the mounting board 10 and the light-shielding frame 5 and in which the lateral wall 7 is deformed to have a desired height by pressing the light-guiding supporting member as described above. The light-shielding frame 5 can be thus easily fixed at a predetermined height, so that variations in the heights of light-emitting devices can be reduced in the manufacturing process of the light-emitting device.

The light-emitting device of the present embodiment is manufactured as described above.

The above descriptions have been made referring to the drawings, each showing a single light-emitting device.

However, in the method for manufacturing a light-emitting device of the present embodiment, it is preferable to produce a plurality of light-emitting devices as a unit using a mounting board and a light-shielding frame including a plurality of unit areas each corresponding to an individual light-emitting device and to divide the product into individual light-emitting devices.

For example, a mounting board including a plurality of (n×m) unit areas forming a plurality of rows (n rows) and a plurality of columns (m columns) may be used as the mounting board.

Also, for example, a light-shielding frame including a plurality of (n×m) unit areas forming a plurality of rows (n rows) and a plurality of columns (m columns) corresponding to the mounting board may be used as the light-shielding frame. Alternatively, for example, a plurality of (n×m) light-shielding frames forming a plurality of rows (n rows) and a plurality of columns (m columns) corresponding to the mounting board may be used, and each of the light-shielding frames may be used as the unit area.

A plurality of light-emitting devices are produced as follows.

(1) One light-emitting element 1 or two or more light-emitting elements 1 are mounted on each unit area in the light-emitting element mounting step.

(2) The light-guiding supporting member is formed on each unit area in the light-guiding supporting member formation step.

(3) In the light-guiding supporting member bonding step, the light-guiding supporting member is bonded to collectively cover the one light-emitting element 1 or the two or more light-emitting elements 1 mounted on each unit area.

(4) In the second light-reflective member formation step, the second light-reflective resin is filled into the space between the mounting board and the light-shielding frame of each unit area.

After the second light-reflective member formation step, the light-reflective member and the mounting board are divided into individual unit areas in the division step to singulate the light-emitting devices. The division can be performed by, for example, cutting with a blade.

The positions of the division into unit areas are preferably away from the outer perimeter of the light-shielding frame 5 in consideration of the division into unit areas. In other words, the light-shielding frame 5 preferably has a size smaller than that of the outer shape of the light-emitting device. In this case, for example, a plurality of light-shielding frames, each of which is a size smaller than the outer shape of the light-emitting device, may be used as the light-shielding frame.

According to the above method for manufacturing a light-emitting device, the light-emitting device is easily manufactured because a plurality of light-emitting devices are produced as a unit and then divided into individual light-emitting devices.

What is claimed is:

1. A method for manufacturing a light-emitting device, the method comprising:
    a mounting step comprising mounting a light-emitting element on or above a mounting board;
    a light-shielding frame placement step comprising placing, on a sheet, a light-shielding frame having an opening having at least one notch at an inner perimeter of the opening;
    a light-transmissive member placement step comprising placing, in the opening, a plate-shaped light-transmissive member having a first surface and a second surface opposite to the first surface, outer perimeters of which are smaller than the inner perimeter of the opening, such that the first surface faces the sheet and such that a gap is formed between the light-transmissive member and the opening;

a light-guiding supporting member formation step comprising producing a light-guiding supporting member in which a first light-reflective member supports the light-shielding frame and the light-transmissive member, the first light-reflective member being formed by pouring a first light-reflective resin into the gap through the at least one notch;

a light-guiding supporting member bonding step comprising fixing the light-guiding supporting member on or above the mounted light-emitting element by bonding the second surface of the light-transmissive member to an upper surface of the light-emitting element; and a second light-reflective member formation step comprising forming a second light-reflective member surrounding the light-emitting element by filling a second light-reflective resin into a space between the mounting board and the light-shielding frame.

2. The method for manufacturing a light-emitting device according to claim 1, wherein the light-shielding frame comprises one notch or two notches.

3. The method for manufacturing a light-emitting device according to claim 1, wherein the opening of the light-shielding frame has a substantially rectangular shape in a top plan view.

4. The method for manufacturing a light-emitting device according to claim 3,
wherein the light-shielding frame comprises one notch, and
wherein the notch is located at a side of the substantially rectangular shape.

5. The method for manufacturing a light-emitting device according to claim 3,
wherein the light-shielding frame comprises two notches, and
wherein the notches are respectively located on two opposite sides of the substantially rectangular shape.

6. The method for manufacturing a light-emitting device according to claim 1, wherein the notch is substantially triangular or substantially semicircular in a top plan view.

7. The method for manufacturing a light-emitting device according to claim 1,
wherein the mounting board and the light-shielding frame comprise a plurality of unit areas,
wherein, in the mounting step, one light-emitting element or two or more light-emitting elements are mounted in each of the unit areas,
wherein, in the light-guiding supporting member formation step, the light-guiding supporting member is formed in each of the unit areas,
wherein, in the light-guiding supporting member bonding step, the light-guiding supporting member is bonded to collectively cover the one light-emitting element or the two or more light-emitting elements mounted in each of the unit areas,
wherein, in the second light-reflective member formation step, the second light-reflective resin is filled into the space between the mounting board and the light-shielding frame in each of the unit areas, and
wherein the method further comprises, after the second light-reflective member formation step, a division step comprising dividing into the unit areas.

8. The method for manufacturing a light-emitting device according to claim 1, further comprising, after the light-guiding supporting member bonding step, a sheet removal step comprising removing the sheet.

9. The method for manufacturing a light-emitting device according to claim 1, wherein, in the light-guiding supporting member bonding step, the light-transmissive member is bonded such that the outer perimeter of the first surface of the light-transmissive member is located outside an outer perimeter of the light-emitting element in a top plan view.

10. The method for manufacturing a light-emitting device according to claim 1, wherein the light-transmissive member comprises a phosphor.

* * * * *